US012648329B2

(12) United States Patent
Seo et al.

(10) Patent No.: US 12,648,329 B2
(45) Date of Patent: Jun. 2, 2026

(54) COLOR CONVERSION SUBSTRATE AND DISPLAY DEVICE INCLUDING THE SAME

(71) Applicant: Samsung Display Co., LTD., Yongin-si (KR)

(72) Inventors: Seunghui Seo, Yongin-si (KR); Soon Tak Jung, Yongin-si (KR); Hyunbae Park, Yongin-si (KR); Hyelynn Song, Yongin-si (KR); Tae Woo Lim, Yongin-si (KR); Moon-Keun Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 449 days.

(21) Appl. No.: 18/487,162

(22) Filed: Oct. 16, 2023

(65) Prior Publication Data

US 2024/0206276 A1     Jun. 20, 2024

(30) Foreign Application Priority Data

Dec. 15, 2022     (KR) ........................ 10-2022-0176150

(51) Int. Cl.
*H10K 59/38*     (2023.01)
*H10K 59/131*     (2023.01)

(52) U.S. Cl.
CPC ........... *H10K 59/38* (2023.02); *H10K 59/131* (2023.02)

(58) Field of Classification Search
CPC ...................................................... H10K 59/38
USPC .................................................. 313/498–512
See application file for complete search history.

(56) References Cited

U.S. PATENT DOCUMENTS

| | | | | |
|---|---|---|---|---|
| 2019/0155147 A1* | 5/2019 | Okumura | .......... | G02F 1/133516 |
| 2021/0273022 A1* | 9/2021 | Park | .......... | G02B 5/26 |
| 2022/0028932 A1* | 1/2022 | Lee | .......... | H10K 59/35 |
| 2023/0005995 A1* | 1/2023 | Lim | .......... | G02B 5/201 |
| 2023/0221632 A1* | 7/2023 | Lee | .......... | G03F 1/00 |
| | | | | 430/5 |

FOREIGN PATENT DOCUMENTS

| | | |
|---|---|---|
| KR | 10-2021-0110451 | 9/2021 |
| KR | 10-2022-0014371 | 2/2022 |
| KR | 10-2023-0007603 | 1/2023 |

* cited by examiner

*Primary Examiner* — Christopher M Raabe
(74) *Attorney, Agent, or Firm* — CANTOR COLBURN LLP

(57)     ABSTRACT

A color conversion substrate includes an upper substrate including a first area and a second area adjacent to the first area and a first color filter, a second color filter, and a third color filter which are disposed on the upper substrate and in the first area and the second area, and an opening corresponding to the first color filter is defined by a one of the second color filter and the third color filter having a smaller stitch error between the first area and the second area.

19 Claims, 8 Drawing Sheets

A1

COLOR CONVERSION SUBSTRATE AND DISPLAY DEVICE INCLUDING THE SAME

CROSS-REFERENCE TO RELATED APPLICATIONS

This application claims priority under 35 U.S.C. § 119 from Korean Patent Application No. 10-2022-0176150 filed on Dec. 15, 2022 in the Korean Intellectual Property Office, the entire content of which are incorporated herein by reference.

BACKGROUND

1. Technical Field

Implementations of the inventive concept relate generally to a color conversion substrate and a display device including the color conversion substrate.

2. Description of the Related Art

Various patterns may be formed in a display device. A photolithography technique may be used to form these patterns. In detail, the photolithography technique includes depositing a film, coating a photoresist on the film, exposing the photoresist using a mask, developing the exposed photoresist to form a photoresist pattern, and testing an alignment of the photoresist pattern, and the like.

As the size of the display device increases, a method of repeatedly exposing the photoresist by dividing the display device into a plurality of shot areas may be used. However, stitch errors (or critical dimension errors) such as shift, rotation, and distortion may occur at the boundaries of the shot areas. In case that the stitch error occurs, stitch stains may be recognized on the display device.

SUMMARY

Embodiments provide a color conversion substrate with improved display quality.

Embodiments provide a display device including the color conversion substrate.

However, embodiments of the disclosure are not limited to those set forth herein. The above and other embodiments will become more apparent to one of ordinary skill in the art to which the disclosure pertains by referencing the detailed description of the disclosure given below.

A color conversion substrate according to an embodiment may include an upper substrate that may include a first area and a second area adjacent to the first area and a first color filter, a second color filter, and a third color filter disposed on the upper substrate in the first area and the second area. An opening that exposes the first color filter may be defined by a one of the second color filter and the third color filter having a smaller stitch error between the first area and the second area.

In an embodiment, an opening that exposes the second color filter may be defined by a one of the first color filter and the third color filter having a smaller stitch error between the first area and the second area.

In an embodiment, an opening that exposes the third color filter may be defined by a one of the first color filter and the second color filter having a smaller stitch error between the first area and the second area.

In an embodiment, a stitch error between the first area and the second area of the first color filter may be in a range of about 0.5 μm to about 1 μm, a stitch error between the first area and the second area of the second color filter may be in a range of about 1 μm to about 1.5 μm, and a stitch error between the first area and the second area of the third color filter may be in a range of about 2 μm to about 3 μm.

In an embodiment, the second color filter may be disposed on the third color filter, the opening that exposes the first color filter is defined by the second color filter, and the second color filter entirely covers the third color filter in a plan view and in a vicinity of the opening that exposes the first color filter.

In an embodiment, the third color filter may be disposed on the first color filter, and an opening that exposes the second color filter may be defined by the first color filter.

In an embodiment, the second color filter may be disposed on the first color filter, and an opening that exposes the third color filter may be defined by the first color filter.

In an embodiment, the upper substrate may include a plurality of shot areas, each of the plurality of shot areas may include the first area and the second area, and ones of the plurality of shot areas overlap each other in the second area in a plan view.

In an embodiment, the color conversion substrate may further include a first color conversion pattern disposed on the first color filter and including a scattering particle, a second color conversion pattern disposed on the second color filter and including a quantum dot, and a third color conversion pattern disposed on the third color filter and including a quantum dot.

In an embodiment, the color conversion substrate may further include a refraction layer disposed on the first to third color filters.

In an embodiment, the first color filter may transmit only light having a wavelength band corresponding to blue; the second color filter may transmit only light having a wavelength band corresponding to green; and the third color filter may transmit only light having a wavelength band corresponding to red.

In an embodiment, the first color filter may be disposed about a periphery of an opening that exposes the second color filter and about a periphery of an opening that exposes the third color filter.

A display device according to an embodiment may include an emission substrate and a color conversion substrate disposed on the emission substrate. The emission substrate may include a lower substrate and a first pixel electrode, a second pixel electrode, and a third pixel electrode disposed on the lower substrate. The color conversion substrate may include an upper substrate including a first area and a second area adjacent to the first area and a first color filter, a second color filter, and a third color filter disposed under the upper substrate and overlapping the first pixel electrode, the second electrode, and the third electrode, respectively. An opening that exposes the first color filter may be defined by a one of the second color filter and the third color filter having a smaller stitch error between the first area and the second area.

In an embodiment, an opening that exposes the second color filter may defined by a one of the first color filter and the third color filter having a smaller stitch error between the first area and the second area.

In an embodiment, an opening that exposes the third color filter may be defined by a one of the first color filter and the second color filter having a smaller stitch error between the first area and the second area.

In an embodiment, the display device may further include an emission layer disposed on the first to third pixel electrodes and a common electrode disposed on the emission layer.

In an embodiment, the display device may further include an active pattern disposed on the lower substrate, a gate electrode disposed on the active pattern, and a connection electrode disposed on the gate electrode and connected to the active pattern.

In an embodiment, the first color filter may transmit only light having a wavelength band corresponding to blue; the second color filter may transmit only light having a wavelength band corresponding to green; and the third color filter may transmit only light having a wavelength band corresponding to red.

In an embodiment, the first color filter may be disposed about a periphery of an opening that exposes the second color filter and about a periphery of an opening that exposes the third color filter.

Therefore, a display device according to embodiments of the disclosure may include an upper substrate, a first color filter, a second color filter, and a third color filter. The upper substrate may include a first area and a second area adjacent to the first area. The first color filter, the second color filter, and the third color filter may be disposed on the upper substrate and be disposed in the first area and the second area. An opening that exposes the first color filter is defined by a one of the second color filter and the third color filter having a smaller stitch error between the first area and the second area.

As the opening of the color filter may be defined by another color filter having a relatively small stitch error, a stitch error occurred between the first area and the second area may be reduced. Accordingly, a stain may not be recognized in a boundary area between the first area and the second area.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
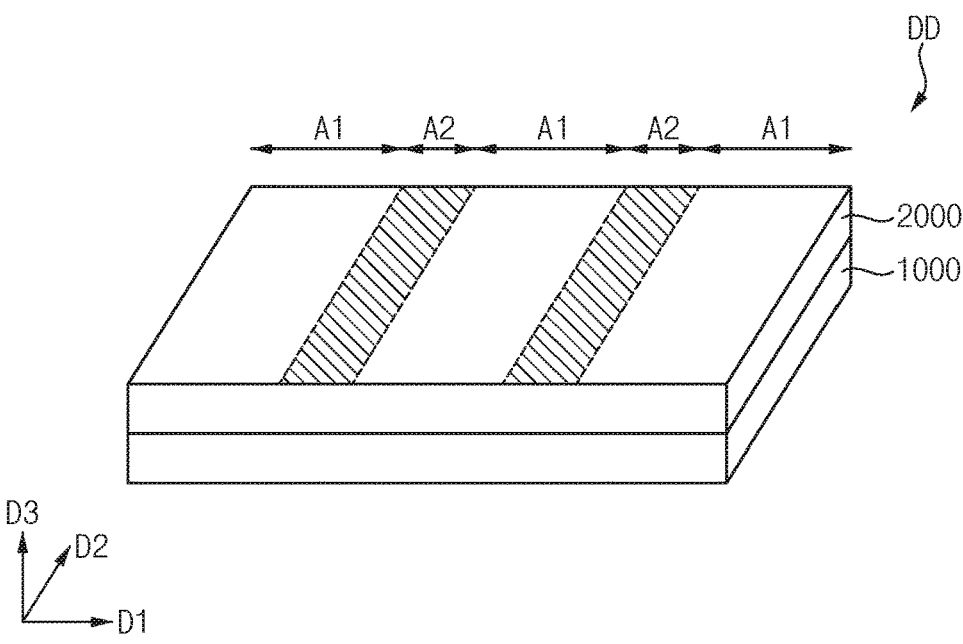
FIG. 1 is a schematic perspective view illustrating a display device according to an embodiment of the disclosure.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals and/or reference characters denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another.

For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2:
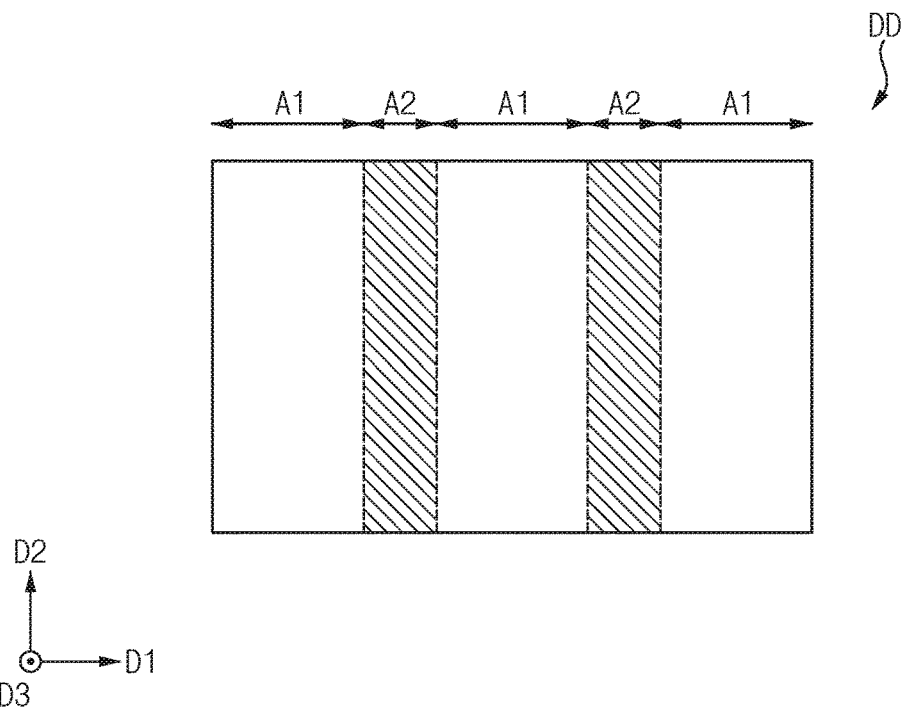
FIG. 2 is a schematic plan view illustrating the display device of FIG. 1.
Figure 3:
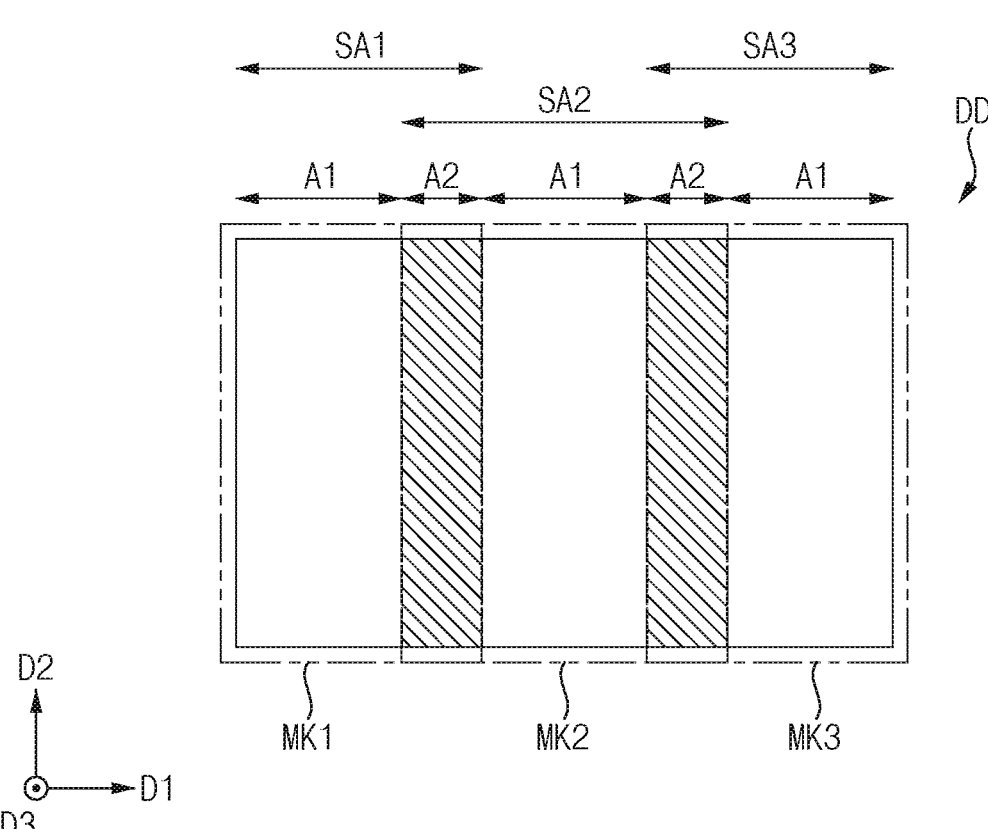
FIG. 3 is a schematic plan view illustrating a stitch error occurring in case of manufacturing a display device.

FIG. 1 is a schematic perspective view illustrating a display device according to an embodiment of the disclosure, FIG. 2 is a schematic plan view illustrating the display device of FIG. 1, and FIG. 3 is a schematic plan view illustrating a stitch error occurring in case that manufacturing a display device. Referring to FIGS. 1 and 2, a display device DD according to an embodiment of the disclosure may include an emission substrate 1000 and a color conversion substrate 2000. The emission substrate 1000 may generate and emit light. In an embodiment, the emission substrate 1000 may include at least one pixel circuit and at least one light emitting diode. The pixel circuit may generate a driving current, and the light emitting diode may emit light corresponding to the driving current. The color conversion substrate 2000 may be disposed on the emission substrate 1000. The color conversion substrate 2000 may convert, transmit, block, and/or absorb the color of light emitted from the emission substrate 1000. Accordingly, the color conversion substrate 2000 may improve color reproducibility of the display device DD.

Referring to FIG. 2, in an embodiment, at least one first area A1 and at least one second area A2 may be defined in the color conversion substrate 2000. For example, as shown in FIG. 2, three first areas A1 and two second areas A2 may be defined in the color conversion substrate 2000. The second area A2 may be positioned between neighboring first areas A1.

A photolithography technique may be used while manufacturing various patterns included in the color conversion substrate 2000. For example, the photolithography technique may include coating a photoresist, exposing the photoresist using a mask, forming a photoresist pattern by developing the exposed photoresist, and testing an alignment of the photoresist pattern.

As the display device DD increases in size, the exposing may be performed by dividing the display device DD into a plurality of shot areas SA1, SA2, and SA3. For example, as shown in FIG. 3, a first shot area SA1 may be exposed using a first mask MK1, a second shot area SA2 may be exposed using a second mask MK2, and a third shot area SA3 may be exposed using a third mask MK3.

While the photoresist in the first area A1 of the first shot area SA1 may be single-exposed, the photoresist in the second area A2 where the first shot area SA1 and the second shot area SA2 overlap may be overlappingly exposed.

Accordingly, a stitch error (or a critical dimension error) may occur between a line width of the photoresist pattern in the first area A1 and a line width of the photoresist pattern in the second area A2.

The display device DD of an embodiment may reduce the stitch error between the first area A1 and the second area A2, and accordingly, a stain may not be visually recognized in a boundary area between the first area A1 and the second area A2.

Figure 4:
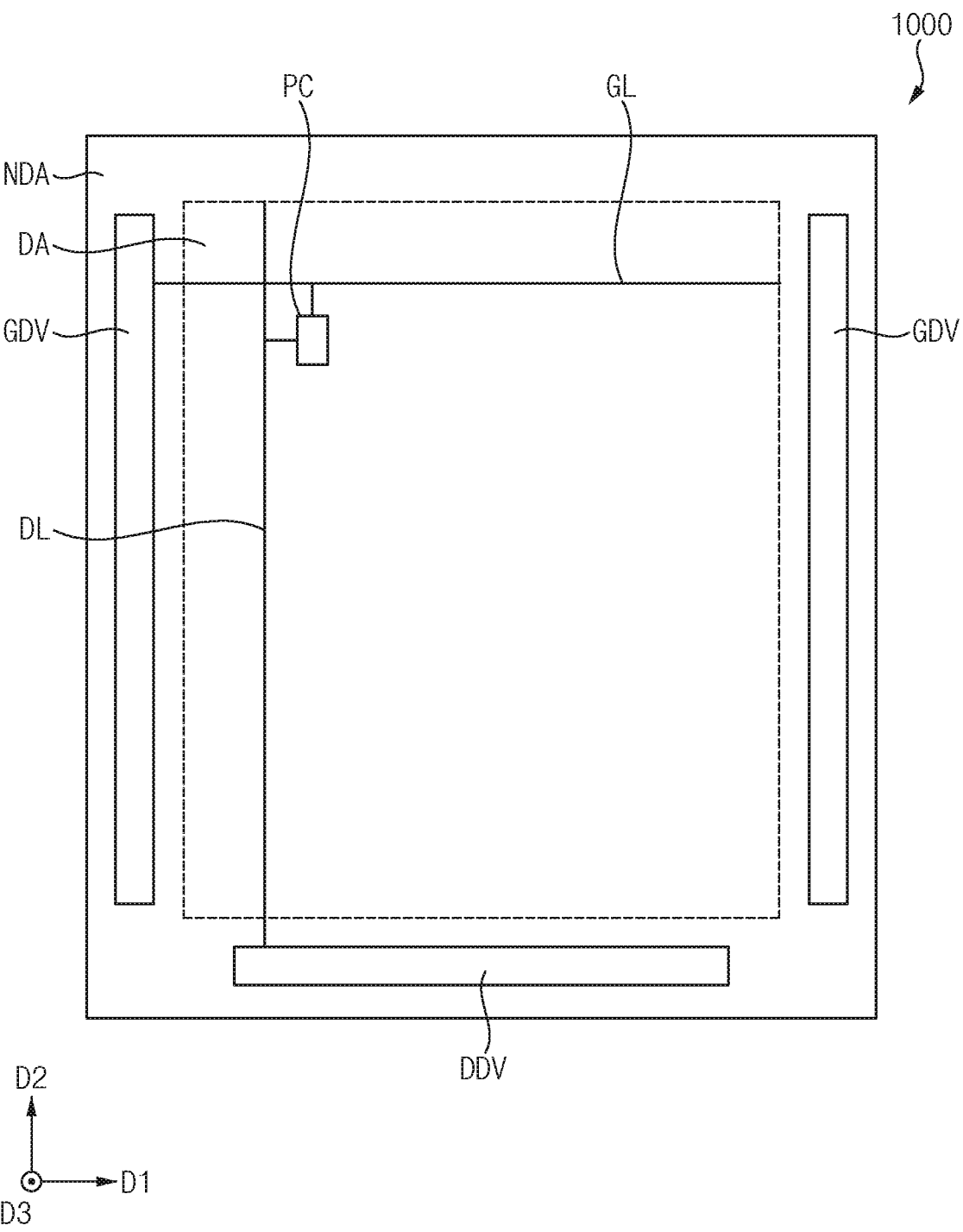
FIG. 4 is a schematic plan view illustrating an emission substrate included in the display device of FIG. 1.
Figure 5:
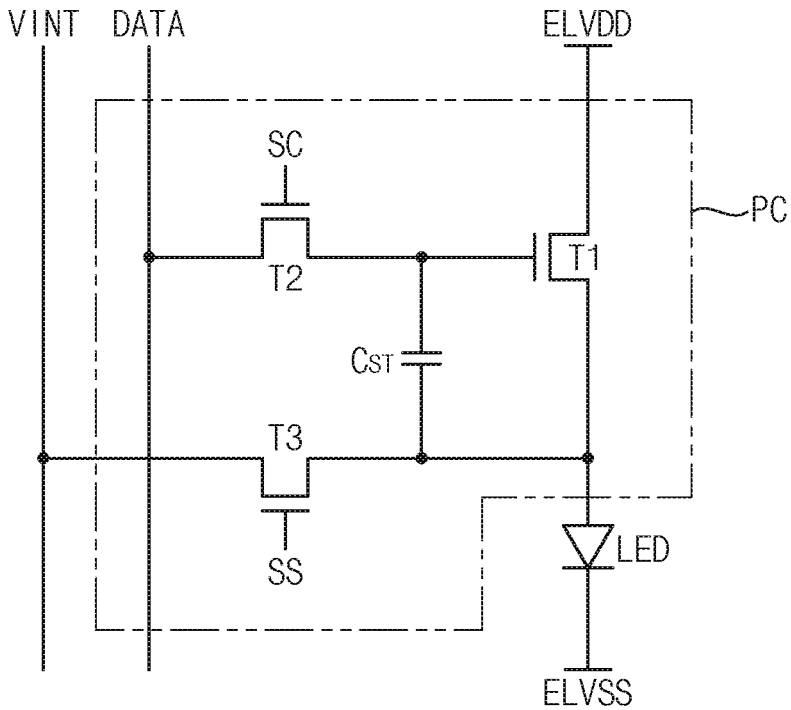
FIG. 5 is a schematic diagram of an equivalent circuit of a pixel included in the emission substrate of FIG. 4.
Figure 6:
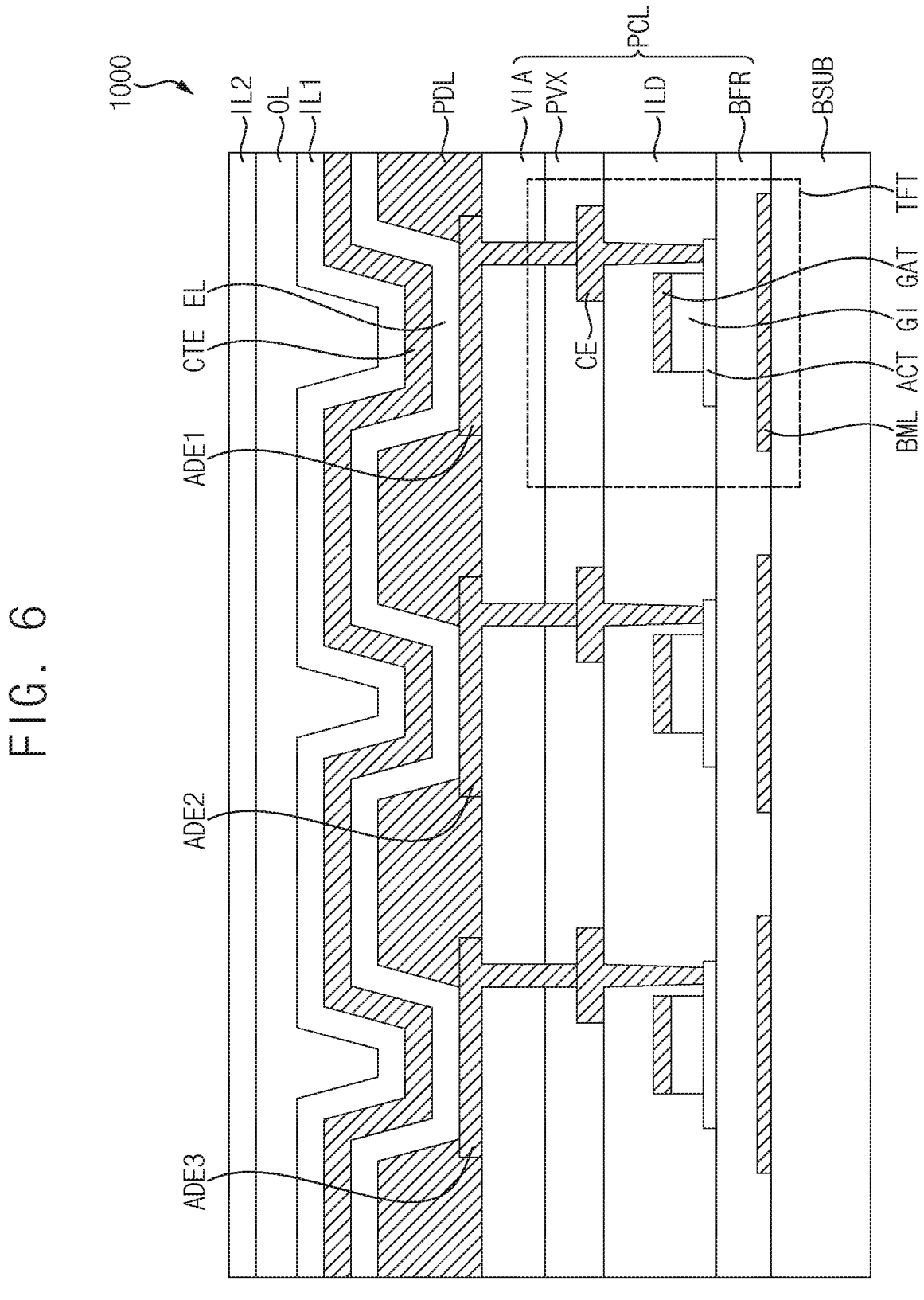
FIG. 6 is a schematic cross-sectional view illustrating the emission substrate of FIG. 4.

FIG. 4 is a schematic plan view illustrating an emission substrate included in the display device of FIG. 1, FIG. 5 is a schematic diagram of an equivalent circuit of a pixel included in the emission substrate of FIG. 4, and FIG. 6 is a schematic cross-sectional view illustrating the emission substrate of FIG. 4. Referring to FIG. 4, the emission substrate 1000 may be divided into a display area DA and a non-display area NDA. An image may be displayed in the display area DA and the non-display area NDA may be positioned to surround at least a portion of the display area DA.

A pixel circuit PC may be disposed in the display area DA. The pixel circuit PC may be electrically connected to a gate line GL extending in a first direction D1 and a data line DL extending in a second direction D2 crossing the first direction D1. The pixel circuit PC may generate the driving current. A gate driver GDV and a data driver DDV may be disposed in the non-display area NDA. The gate driver GDV may generate a gate signal. The gate signal may be transmitted to the pixel circuit PC through the gate line GL. The data driver DDV may generate a data voltage. The data voltage may be transmitted to the pixel circuit PC through the data line DL.

Referring to FIG. 5, the pixel circuit PC may include a first transistor T1, a second transistor T2, a third transistor T3, and a storage capacitor $C_{ST}$. The pixel circuit PC may be electrically connected to the light emitting diode LED. The pixel circuit PC may generate the driving current, and the light emitting diode LED may emit light in response to the driving current.

The first transistor T1 may include a gate terminal, a first terminal, and a second terminal. The gate terminal may be electrically connected to the second transistor T2. The first terminal may receive a first voltage ELVDD. The second terminal may be electrically connected to the light emitting diode LED. The first transistor T1 may generate the driving current.

The second transistor T2 may include a gate terminal, a first terminal, and a second terminal. The gate terminal may receive a first gate signal SC. The first terminal may receive a data voltage DATA. The second terminal may be electrically connected to the first transistor T1. The second transistor T2 may transmit the data voltage DATA in response to the first gate signal SC.

The third transistor T3 may include a gate terminal, a first terminal, and a second terminal. The gate terminal may receive the second gate signal SS. The first terminal may receive an initialization voltage VINT. The second terminal may be electrically connected to the light emitting diode LED. The third transistor T3 may transmit the initialization voltage VINT in response to the second gate signal SS.

The storage capacitor $C_{ST}$ may include a first terminal and a second terminal. The first terminal may be electrically connected to the gate terminal of the first transistor T1. The second terminal may be electrically connected to the second terminal of the first transistor T1.

The light emitting diode LED may include a first terminal and a second terminal. The first terminal may be electrically connected to the first transistor T1. The second terminal may receive a second voltage ELVSS.

Referring to FIG. 6, the emission substrate 1000 may include a lower substrate BSUB, a lower metal pattern BML, a buffer layer BFR, an active pattern ACT, a gate insulating layer GI, a gate electrode GAT, an interlayer insulating layer ILD, a connection electrode CE, a passivation layer PVX, a via insulating layer VIA, a first pixel electrode ADE1, a second pixel electrode ADE2, a third pixel electrode ADE3, a pixel defining layer PDL, an emission layer EL, a common electrode CTE, a first inorganic layer IL1, an organic layer OL, and a second inorganic layer IL2. The lower metal pattern BML, the active pattern ACT, the gate electrode GAT, and the connection electrode CE may constitute a transistor TFT. The lower metal pattern BML, the buffer layer BFR, the active pattern ACT, the gate insulating layer GI, the gate electrode GAT, the interlayer insulating layer ILD, the connection electrode CE, the passivation layer PVX, and the via insulation layer VIA may be defined as a pixel circuit layer PCL.

The lower substrate BSUB may include a transparent or opaque material. In an embodiment, examples of a material that can be used as the lower substrate BSUB may include glass, quartz, plastic, and the like. These may be used alone or in combination with each other. The lower substrate BSUB may be composed of a single layer or multiple layers in combination with each other.

The lower metal pattern BML may be disposed on the lower substrate BSUB. In an embodiment, the lower metal pattern BML may be formed of a metal, an alloy, a conductive metal oxide, a transparent conductive material, the like, or a combination thereof. Examples of materials that can be used as the lower metal pattern BML may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like. These may be used alone or in combination with each other. The lower metal pattern BML may be formed as a single layer or as multiple layers in combination with each other.

The buffer layer BFR may be disposed on the lower substrate BSUB and may cover the lower metal pattern BML. In an embodiment, the buffer layer BFR may be formed of an inorganic insulating material. Examples of materials that can be used as the inorganic insulating material may include silicon oxide, silicon nitride, and silicon oxynitride. These may be used alone or in combination with each other. The buffer layer BFR may prevent metal atoms or atoms or impurities from diffusing into the active pattern ACT from the lower substrate BSUB. The buffer layer BFR may control a heat supply rate during a crystallization technique for forming the active pattern ACT.

The active pattern ACT may be disposed on the buffer layer BFR. In an embodiment, the active pattern ACT may be formed of a silicon semiconductor material or an oxide semiconductor material. Examples of the silicon semiconductor material that can be used for the active pattern ACT may include amorphous silicon, polycrystalline silicon, or a combination thereof. Examples of the oxide semiconductor material that can be used for the active pattern ACT may include InGaZnO ("IGZO"), InSnZnO ("ITZO"), or a combination thereof. The oxide semiconductor material may further include indium ("In"), gallium ("Ga"), tin ("Sn"), zirconium ("Zr"), vanadium ("V"), hafnium ("Hf"), cadmium ("Cd"), germanium ("Ge"), chromium ("Cr"), titanium ("Ti"), and zinc ("Zn"). These may be used alone or in combination with each other.

The gate insulating layer GI may be disposed on the active pattern ACT. In an embodiment, the gate insulating layer GI may be formed of an insulating material. Examples of an insulating material that can be used as the gate insulating layer GI may include silicon oxide, silicon nitride, and silicon oxynitride. These may be used alone or in combination with each other.

The gate electrode GAT may be disposed on the gate insulating layer GI. In an embodiment, the gate electrode GAT may be formed of metal, alloy, conductive metal oxide, transparent conductive material, the like, or a combination thereof. Examples of materials that can be used for the gate electrode GAT may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like. These may be used alone or in combination with each other.

In an embodiment, the gate electrode GAT may be formed of a single layer or multiple layers in combination with each other. For example, the gate electrode GAT may include a titanium layer and a copper layer disposed on the titanium layer. In other words, the gate electrode GAT may have a Ti/Cu structure.

The interlayer insulating layer ILD may be disposed on the buffer layer BFR and the gate insulating layer GI. The interlayer insulating layer ILD may cover the gate electrode GAT. In an embodiment, the interlayer insulating layer ILD may be formed of an insulating material. Examples of insulating materials that can be used as the interlayer insulating layer ILD may include silicon oxide, silicon nitride, and silicon oxynitride. These may be used alone or in combination with each other.

The connection electrode CE may be disposed on the interlayer insulating layer ILD. The connection electrode CE may contact the active pattern ACT. In an embodiment, the connection electrode CE may be formed of a metal, an alloy, a conductive metal oxide, a transparent conductive material, or the like. Examples of materials that can be used as the connection electrode CE may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like. These may be used alone or in combination with each other.

In an embodiment, the connection electrode CE may be composed of a single layer or multiple layers in combination with each other. For example, the connection electrode CE may include a titanium layer, a copper layer disposed on the titanium layer, and an indium tin oxide (ITO) layer disposed on the copper layer. In other words, the connection electrode CE may have a Ti/Cu/ITO structure.

The passivation layer PVX may be disposed on the interlayer insulating layer ILD. The passivation layer PVX may cover the connection electrode CE. In an embodiment, the passivation layer PVX may be formed of an inorganic insulating material. Examples of inorganic insulating materials that can be used as the passivation layer PVX may include silicon oxide, silicon nitride, and silicon oxynitride. These may be used alone or in combination with each other. In another embodiment, the passivation layer PVX may be omitted.

The via insulation layer VIA may be disposed on the passivation layer PVX. In an embodiment, the via insulation layer VIA may be formed of an organic material. Examples of organic materials that can be used as the via insulation layer VIA may include photoresist, polyacrylic resin, polyimide resin, and acrylic resin. These may be used alone or in combination with each other.

In another embodiment, the passivation layer PVX may be omitted. The via insulating layer VIA may include an organic material and an inorganic material. Examples of materials that can be used as the via insulation layer VIA may include photoresist, polyacrylic resin, polyimide resin, acrylic resin, silicon oxide, silicon nitride, and silicon oxynitride. These may be used alone or in combination with each other.

The first to third pixel electrodes ADE1, ADE2, and ADE3 may be disposed on the via insulation layer VIA. The first to third pixel electrodes ADE1, ADE2, and ADE3 may be electrically connected to corresponding transistors, respectively. In an embodiment, the first to third pixel electrodes ADE1, ADE2, and ADE3 may be formed of metal, alloy, conductive metal oxide, transparent conductive material, the like, or a combination thereof. Examples of materials that can be used for the first to third pixel electrodes ADE1, ADE2, and ADE3 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like. These may be used alone or in combination with each other. In an embodiment, each of the first to third pixel electrodes ADE1, ADE2, and ADE3 may be configured as a single layer or as a multi-layer combined with each other. For example, each of the first to third pixel electrodes ADE1, ADE2, and ADE3 may have an ITO/Ag/ITO structure.

The pixel defining layer PDL may be disposed on the via insulating layer VIA. An opening exposing the first to third pixel electrodes ADE1, ADE2, and ADE3 may be formed in the pixel defining layer PDL. In an embodiment, the pixel defining layer PDL may be formed of an organic material. Examples of organic materials that can be used as the pixel defining layer PDL may include photoresist, polyacrylic resin, polyimide resin, and acrylic resin. These may be used alone or in combination with each other.

The emission layer EL may be disposed on the first pixel electrode ADE1, the second pixel electrode ADE2, the third pixel electrode ADE3, and the pixel defining layer PDL. In an embodiment, the emission layer EL may be formed in the entire area including the display area DA and the non-display area NDA. For example, the emission layer EL may have a multilayer structure in which a plurality of layers may be stacked on each other. The emission layer EL may emit light of different colors. In another embodiment, the emission layer EL may be disposed within the opening of the pixel defining layer PDL. The common electrode CTE may be disposed on the emission layer EL. The emission layer EL may emit light.

The first inorganic layer IL1 may be disposed on the common electrode CTE. In an embodiment, the first inorganic layer IL1 may be formed of an inorganic material. Examples of inorganic materials that can be used as the first inorganic layer IL1 may include silicon oxide, silicon nitride, and silicon oxynitride. These may be used alone or in combination with each other.

The organic layer OL may be disposed on the first inorganic layer IL1. In an embodiment, the organic layer OL may be formed of an organic material. Examples of organic materials that can be used as the organic layer OL may include photoresist, polyacrylic resin, polyimide resin, and acrylic resin. These may be used alone or in combination with each other.

The second inorganic layer IL2 may be disposed on the organic layer OL. In an embodiment, the second inorganic layer IL2 may be formed of an inorganic material. Examples of inorganic materials that can be used as the second inorganic layer IL2 may include silicon oxide, silicon nitride, and silicon oxynitride. These may be used alone or in combination with each other.

Figure 7:
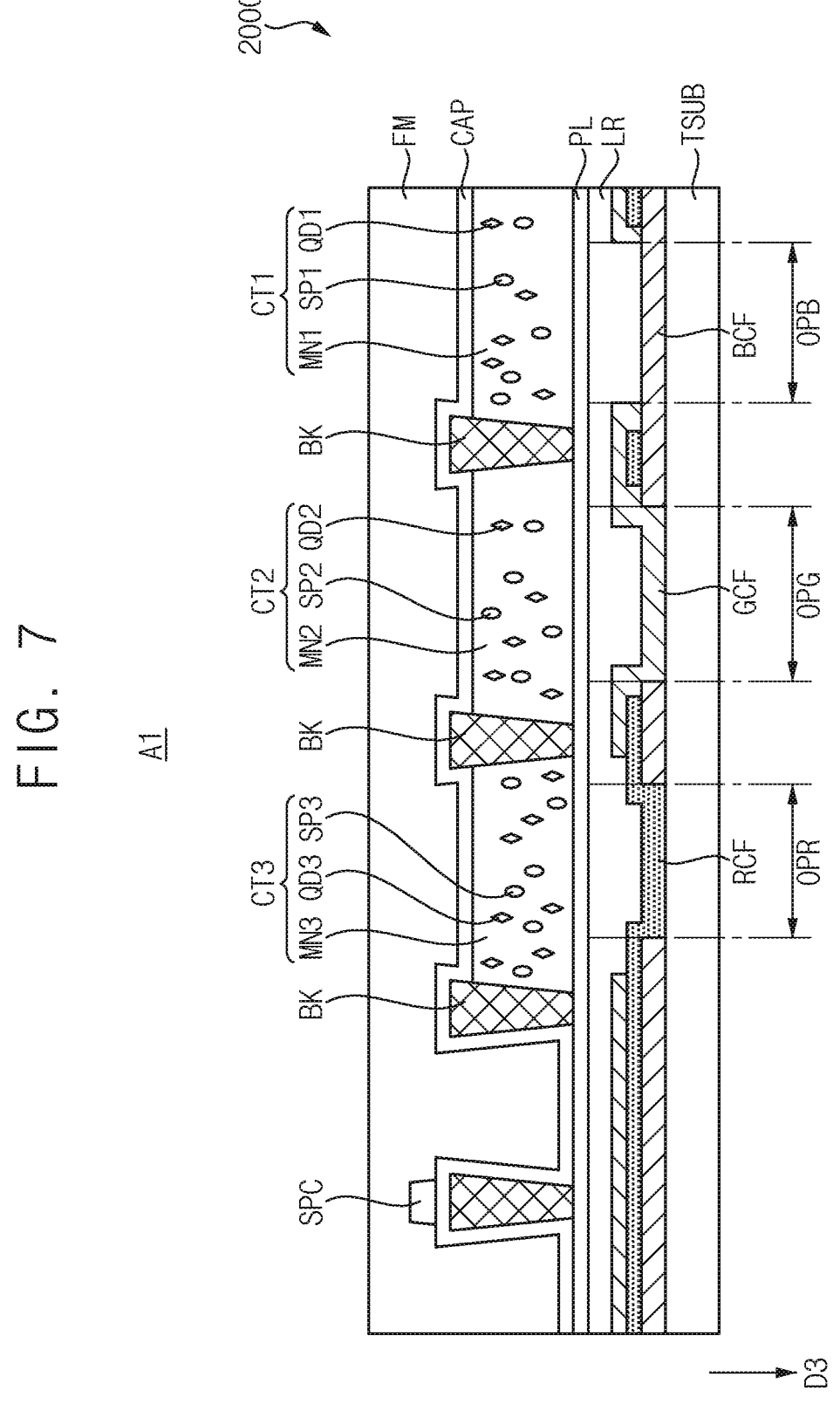
FIG. 7 is a schematic cross-sectional view illustrating a first area of a color conversion substrate included in the display device of FIG. 1.
Figure 8:
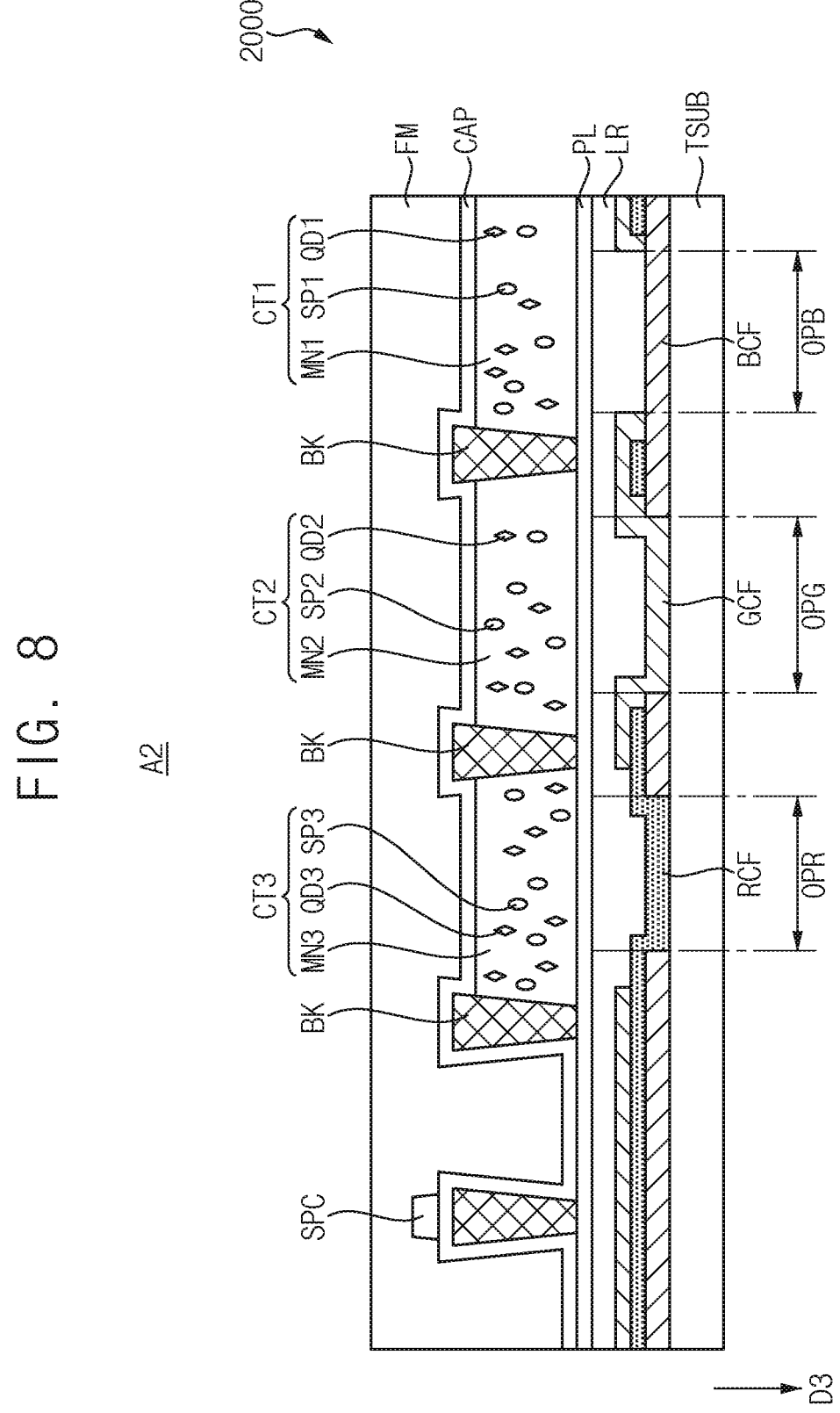
FIG. 8 is a schematic cross-sectional view illustrating a second area of a color conversion substrate included in the display device of FIG. 1.

FIG. 7 is a schematic cross-sectional view illustrating a first area A1 of a color conversion substrate included in the display device of FIG. 1, and FIG. 8 is a schematic cross-sectional view illustrating a second area A2 of a color conversion substrate included in the display device of FIG. 1. Referring to FIG. 7, the first area A1 of the color conversion substrate 2000 may include an upper substrate TSUB, a first color filter BCF, a second color filter GCF, a third color filter RCF, a refraction layer LR, a protective layer PL, a partition wall or bank BK, a first color conversion pattern CT1, a second color conversion pattern CT2, a third color conversion pattern CT3, a capping layer CAP, a spacer SPC, and a filler FM.

The upper substrate TSUB may include a transparent or opaque material. In an embodiment, examples of materials that can be used as the upper substrate TSUB may include glass, quartz, and plastic. These may be used alone or in combination with each other. The upper substrate TSUB may be composed of a single layer or multiple layers in combination with each other.

The first color filter BCF may be disposed on the upper substrate TSUB. In an embodiment, the first color filter BCF may transmit only light having a wavelength band corresponding to blue. For example, the first color filter BCF may include photoresist, acrylic resin, epoxy resin, or polyimide resin, and may be patterned through the above-described exposure technique.

The second color filter GCF may be disposed on the upper substrate TSUB. In an embodiment, the second color filter GCF may transmit only light having a wavelength band corresponding to green. For example, the second color filter GCF may include photoresist, acrylic resin, epoxy resin, or polyimide resin, and may be patterned through the above-described exposure technique.

The third color filter RCF may be disposed on the upper substrate TSUB. In an embodiment, the third color filter RCF may transmit only light having a wavelength band corresponding to red. For example, the third color filter RCF may include photoresist, acrylic resin, epoxy resin, or polyimide resin, and may be patterned through the above-described exposure technique.

In an embodiment, the first color filter BCF may be exposed through a first opening OPB defined by the second color filter GCF. In other words, the second color filter GCF overlapping the first color filter BCF in a plan view may be patterned, and the line width of the removed portion of the second color filter GCF may define the first opening OPB.

In an embodiment, the second color filter GCF may be exposed through a second opening OPG defined by the first color filter BCF. In other words, the first color filter BCF overlapping the second color filter GCF in a plan view may be patterned, and the line width of the removed portion of the first color filter BCF may define the second opening OPG.

In an embodiment, the third color filter RCF may be exposed through a third opening OPR defined by the first color filter BCF. In other words, the first color filter BCF overlapping the third color filter RCF in a plan view may be patterned, and the line width of the removed portion of the first color filter BCF may define the third opening OPR.

The refraction layer LR may be disposed on the first to third color filters BCF, GCF, and RCF. The refraction layer LR may entirely cover the first color filter BCF, the second color filter GCF, and the third color filter RCF. In an embodiment, the refraction layer LR may include a material having a relatively low refractive index (or a material having a relatively high refractive index).

The protective layer PL may be entirely disposed on the refraction layer LR. In an embodiment, the protective layer PL may include an inorganic material. For example, the protective layer PL may be formed of silicon oxide ("$SiO_2$"), silicon nitride ("$SiN_x$"), silicon oxynitride ("SiON"), aluminum oxide ("$Al_2O_3$"), titanium dioxide ("$TiO_2$"), tantalum dioxide ("$Ta_2O_5$"), hafnium dioxide ("$HfO_2$"), zinc dioxide ("$ZnO_2$"), or a combination thereof.

The bank BK may be disposed on the protective layer PL. The bank BK may be formed to surround the first to third openings OPB, OPG, and OPR. In an embodiment, the bank BK may include a light blocking material that blocks or absorbs light. For example, the bank BK may include black pigment, black dye, chromium ("Cr"), chromium oxide ("$CrO_x$"), chromium nitride ("$CrN_x$"), graphite, the like, or a combination thereof.

The first color conversion pattern CT1 may be disposed on the protective layer PL. In an embodiment, the first color conversion pattern CT1 may overlap the first color filter BCF and may be accommodated by the bank BK. In an embodiment, the first color conversion pattern CT1 may include a first monomer MN1, a first quantum dot QD1, and a first scattering particle SP1. The first quantum dot QD1 and the first scattering particle SP1 may be dispersed in the first monomer MN1. In an embodiment, the first monomer MN1 may include an epoxy-based monomer, an ester-based monomer, or a combination thereof. The first quantum dot QD1 may convert the color of incident light to blue. For example, the first quantum dot QD1 may be a quantum dot, and may be selected from the group consisting of a group II-VI compound, a group IV-VI compound, a group IV element, a group IV compound, and a combination thereof. However, in another embodiment, the first color conversion pattern CT1 may not include the first quantum dot QD1. The first scattering particle SP1 may scatter light. In an embodiment, the first scattering particle SP1 may include a titanium dioxide ("$TiO_2$") particle, a zinc oxide ("ZnO") particle, an aluminum oxide ("$AL_2O_3$") particle, a silicon oxide ("$SiO_2$") particle, a hollow silica particle, the like, or a combination thereof.

The second color conversion pattern CT2 may be disposed on the protective layer PL. In an embodiment, the second color conversion pattern CT2 may overlap the second color filter GCF and may be accommodated by the bank BK. In an embodiment, the second color conversion pattern CT2 may include a second monomer MN2, a second quantum dot QD2, and a second scattering particle SP2. The second quantum dot QD2 and the second scattering particle SP2 may be dispersed in the second monomer MN2. In an embodiment, the second monomer MN2 may include an epoxy-based monomer, an ester-based monomer, or a combination thereof.

The second quantum dot QD2 may convert the color of incident light to green. For example, the second quantum dot QD2 may be a quantum dot, and may be selected from the group consisting of a group II-VI compound, a group IV-VI compound, a group IV element, a group IV compound, and a combination thereof. The second scattering particle SP2 may scatter light. In an embodiment, the second scattering particle SP2 may include a titanium dioxide ("$TiO_2$") particle, a zinc oxide ("ZnO") particle, an aluminum oxide ("$Al_2O_3$") particle, a silicon oxide ("$SiO_2$") particle, a hollow silica particle, the like, or a combination thereof.

The third color conversion pattern CT3 may be disposed on the protective layer PL. In an embodiment, the third color conversion pattern CT3 may overlap the third color filter RCF and may be accommodated by the bank BK. In an embodiment, the third color conversion pattern CT3 may include a third monomer MN3, a third quantum dot QD3, and a third scattering particle SP3. The third quantum dot QD3 and the third scattering particle SP3 may be dispersed in the third monomer MN3. In an embodiment, the third monomer MN3 may include an epoxy-based monomer, an ester-based monomer, or a combination thereof.

The third quantum dot QD3 may convert the color of incident light to red. For example, the third quantum dot QD3 may be a quantum dot, and may be selected from the group consisting of a group II-VI compound, a group IV-VI compound, a group IV element, a group IV compound, and a combination thereof. The third scattering particle SP3 may scatter light. In an embodiment, the third scattering particle SP3 may include a titanium dioxide ("$TiO_2$") particle, a zinc oxide ("ZnO") particle, an aluminum oxide ("$Al_2O_3$") particle, a silicon oxide ("$SiO_2$") particle, a hollow silica particle, the like, or a combination thereof.

The capping layer CAP may be disposed on the first to third color conversion patterns CT1, CT2, and CT3. The capping layer CAP may entirely cover the first to third color conversion patterns CT1, CT2, and CT3. The spacer SPC may be disposed on the bank BK. The filler FM may be disposed on the capping layer CAP. In an embodiment, the filler FM may include an organic material having a relatively high refractive index. For example, the filler FM may include a urethane-based resin, an epoxy-based resin, or an acrylic-based resin.

Referring to FIG. 8, the second area A2 of the color conversion substrate 2000 may be substantially a same as the color conversion substrate 2000 of the first area A1. However as described above, since the first area A1 may be a single-exposed area and the second area A2 may be an overlappingly exposed area, the stitch error (or a critical dimension error) may occur between the line width of a color filter in the first area A1 and the line width of a color filter in the second area A2.

In an embodiment, the stitch error between the first area A1 and the second area A2 of the first color filter BCF may be smaller than the stitch error between the first area A1 and the second areas A2 of the second color filter GCF. The stitch error between the first area A1 and the second area A2 of the second color filter GCF may be smaller than the stitch error between the first area A1 and the second area A2 of the third color filter RCF. For example, the stitch error between the first area A1 and the second area A2 of the first color filter BCF may be about 0.5 μm to about 1 μm. Accordingly, the line width of a portion of the first color filter BCF removed from the first area A1 may be about 76 μm, and the line width of a portion of the first color filter BCF removed from the second area A2 may be about 75 μm.

For example, the stitch error between the first area A1 and the second area A2 of the second color filter GCF may be about 1 μm to about 1.5 μm. Accordingly, the line width of a portion of the second color filter GCF removed from the first area A1 may be about 43 μm, and the line width of a portion of the second color filter GCF removed from the second area A2 may be about 44.5 μm.

For example, the stitch error between the first area A1 and the second area A2 of the third color filter RCF may be about 2 μm to about 3 μm. Accordingly, the line width of a portion of the third color filter RCF removed from the first area A1 may be about 117 μm, and the line width of a portion of the third color filter RCF removed from the second area A2 may be about 119.5 μm.

In an embodiment, as shown in FIGS. 7 and 8, the second color filter GCF may be disposed on the third color filter RCF. As described above, the stitch error of the second color filter GCF may be smaller than the stitch error of the third color filter RCF. Accordingly, the first opening OPB may be defined by the second color filter GCF. In other words, in the periphery of the first opening OPB, the second color filter GCF may entirely cover the third color filter RCF in cross-section.

In an embodiment, the third color filter RCF may be disposed on the first color filter BCF. As described above, the stitch error of the first color filter BCF may be smaller than the stitch error of the third color filter RCF. Accordingly, the second opening OPG may be defined by the first color filter BCF.

In an embodiment, the second color filter GCF may be disposed on the first color filter BCF. As described above, the stitch error of the first color filter BCF may be smaller than the stitch error of the second color filter GCF. Accordingly, the third opening OPR may be defined by the first color filter BCF.

As each of the first to third openings OPB, OPG, and OPR may be defined by a color filter having a relatively small stitch error, the stitch error between the first area A1 and the second area A2 may be reduced. Accordingly, the stain may not be recognized in the boundary area between the first area A1 and the second area A2.

Figure 9:
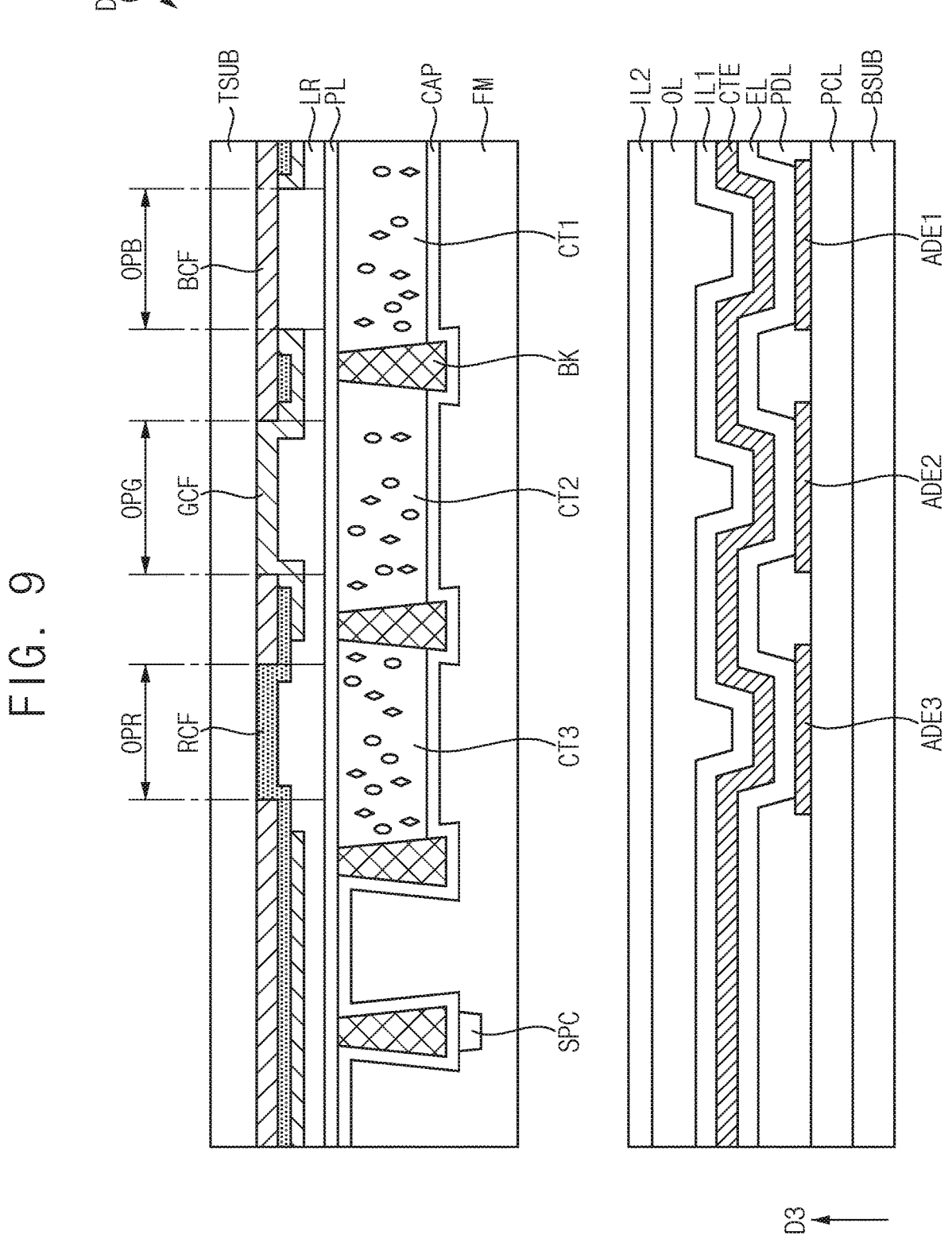
FIG. 9 is a schematic cross-sectional view illustrating the display device of FIG. 1.

FIG. 9 is a schematic cross-sectional view illustrating the display device of FIG. 1. Referring to FIG. 9, the display device DD may include the emission substrate 1000 and the color conversion substrate 2000. As described above, the emission substrate 1000 may include the first to third pixel electrodes ADE1, ADE2, and ADE3, and the color conversion substrate 2000 may include the first to third color filters BCF, GCF, and RCF. The color conversion substrate 2000 may be combined with the emission substrate 1000 such that the first to third color filters BCF, GCF, and RCF overlap the first to third pixel electrodes ADE1, ADE2, and ADE3 respectively in a plan view. In other words, the first to third openings OPB, OPG, and OPR may overlap the first to third pixel electrodes ADE1, ADE2, and ADE3 respectively in a plan view.

Only the case where the stitch error of the first color filter BCF may be smaller than the stitch error of the second color filter GCF and the stitch error of the second color filter BCF may be smaller than the stitch error of the third color filter RCF has been illustrated in this description, but the disclosure may not be limited thereto. For example, a stitch error of the first color filter BCF may instead be greater than a stitch error of the second color filter GCF. Accordingly, the third opening OPR through which the third color filter RCF may be exposed may be defined by the second color filter GCF.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A color conversion substrate comprising:
an upper substrate including a first area and a second area adjacent to the first area; and
a first color filter, a second color filter, and a third color filter disposed on the upper substrate in the first area and the second area,
wherein an opening that exposes the first color filter is defined by a one of the second color filter and the third color filter having a smaller stitch error between the first area and the second area.

2. The color conversion substrate of claim 1, wherein an opening that exposes the second color filter is defined by a one of the first color filter and the third color filter having a smaller stitch error between the first area and the second area.

3. The color conversion substrate of claim 1, wherein an opening that exposes the third color filter is defined by a one of the first color filter and the second color filter having a smaller stitch error between the first area and the second area.

4. The color conversion substrate of claim 1, wherein
a stitch error between the first area and the second area of the first color filter is in a range of about 0.5 μm to about 1 μm,
a stitch error between the first area and the second area of the second color filter is in a range of about 1 μm to about 1.5 μm, and
a stitch error between the first area and the second area of the third color filter is in a range of about 2 μm to about 3 μm.

5. The color conversion substrate of claim 4, wherein
the second color filter is disposed on the third color filter,
the opening that exposes the first color filter is defined by the second color filter, and
the second color filter entirely covers the third color filter in a plan view and in a vicinity of the opening that exposes the first color filter.

6. The color conversion substrate of claim 5, wherein
the third color filter is disposed on the first color filter, and
an opening that exposes the second color filter is defined by the first color filter.

7. The color conversion substrate of claim 6, wherein
the second color filter is disposed on the first color filter, and
an opening that exposes the third color filter is defined by the first color filter.

8. The color conversion substrate of claim 1, wherein
the upper substrate includes a plurality of shot areas,
each of the plurality of shot areas includes the first area and the second area, and
ones of the plurality of shot areas overlap each other in the second area in a plan view.

9. The color conversion substrate of claim 1, further comprising:
a first color conversion pattern disposed on the first color filter and including a scattering particle;
a second color conversion pattern disposed on the second color filter and including a quantum dot; and
a third color conversion pattern disposed on the third color filter and including a quantum dot.

10. The color conversion substrate of claim 1, further comprising:
a refraction layer disposed on the first to third color filters.

11. The color conversion substrate of claim 1, wherein
the first color filter transmits only light having a wavelength band corresponding to blue;
the second color filter transmits only light having a wavelength band corresponding to green; and
the third color filter transmits only light having a wavelength band corresponding to red.

12. The color conversion substrate of claim 1, wherein the first color filter being disposed about a periphery of an opening that exposes the second color filter and about a periphery of an opening that exposes the third color filter.

13. A display device comprising:
an emission substrate; and
a color conversion substrate disposed on the emission substrate, wherein
the emission substrate includes:
a lower substrate; and
a first pixel electrode, a second pixel electrode, and a third pixel electrode disposed on the lower substrate,
the color conversion substrate includes:
an upper substrate including a first area and a second area adjacent to the first area; and
a first color filter, a second color filter, and a third color filter disposed under the upper substrate and overlapping the first pixel electrode, the second electrode, and the third electrode, respectively in a plan view, and
an opening that exposes the first color filter is defined by a one of the second color filter and the third color filter having a smaller stitch error between the first area and the second area.

14. The display device of claim 13, wherein an opening that exposes the second color filter is defined by a one of the first color filter and the third color filter having a smaller stitch error between the first area and the second area.

15. The display device of claim 13, wherein an opening that exposes the third color filter is defined by a one of the first color filter and the second color filter having a smaller stitch error between the first area and the second area.

16. The display device of claim 13, further comprising:
an emission layer disposed on the first to third pixel electrodes; and
a common electrode disposed on the emission layer.

17. The display device of claim 16, further comprising:
an active pattern disposed on the lower substrate;
a gate electrode disposed on the active pattern; and
a connection electrode disposed on the gate electrode and electrically connected to the active pattern.

18. The display device of claim 13, wherein
the first color filter transmits only light having a wavelength band corresponding to blue;
the second color filter transmits only light having a wavelength band corresponding to green; and
the third color filter transmits only light having a wavelength band corresponding to red.

19. The display device of claim 13, wherein the first color filter being disposed about a periphery of an opening that exposes the second color filter and about a periphery of an opening that exposes the third color filter.

* * * * *